(12) United States Patent
Kampf

(10) Patent No.: US 6,657,565 B2
(45) Date of Patent: Dec. 2, 2003

(54) METHOD AND SYSTEM FOR IMPROVING LOSSLESS COMPRESSION EFFICIENCY

(75) Inventor: Francis A. Kampf, Jeffersonville, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/063,107

(22) Filed: Mar. 21, 2002

(65) Prior Publication Data

US 2003/0179114 A1 Sep. 25, 2003

(51) Int. Cl.[7] ................................................ H03M 7/38
(52) U.S. Cl. ........................................... 341/51; 341/67
(58) Field of Search .............................. 341/51, 50, 67; 707/6; 710/68

(56) References Cited

U.S. PATENT DOCUMENTS

| | | | |
|---|---|---|---|
| 4,843,389 A | | 6/1989 | Lisle et al. |
| 5,184,126 A | * | 2/1993 | Nagy .......................... 341/67 |
| 5,298,895 A | | 3/1994 | Van Maren |
| 5,373,290 A | | 12/1994 | Lempel et al. |
| 5,379,036 A | | 1/1995 | Storer |
| 5,384,567 A | * | 1/1995 | Hassner et al. ................ 341/51 |
| 5,426,779 A | * | 6/1995 | Chambers, IV ................ 707/6 |
| 5,572,209 A | | 11/1996 | Farmer et al. |
| 5,610,603 A | | 3/1997 | Plambeck |
| 5,778,255 A | * | 7/1998 | Clark et al. ................... 710/68 |
| 6,067,381 A | | 5/2000 | Benayoun et al. |

FOREIGN PATENT DOCUMENTS

| WO | WO 95/19662 | * 7/1995 |
|---|---|---|

OTHER PUBLICATIONS

*ALDC–15S Data Compression,* Data Sheet, IBM Microelectornics, Jun. 15, 1994, pp 1–1 thru 1–2; 2–1 thru 2–3; 4–1, DCALD5DSU–04, IBM.

*ALDC1–40S–M Data Compression,* Data Sheet, (IBM Microelectornics Division), Nov. 2, 1994, pp 1–1, 2–1– 2–3, DCALD40DSU–02, IBM.

Ranganathan et al., *A Lossless Image Compression Algorithm Using Variable Block Size Segmentation,* (IEEE) Oct. 1995, pp 1396–1406, vol. 4, No. 10, IEEE.

Slattery, *Design Considerations for the ALDC Cores* (IBM Journal of Research and Development), Nov. 1998, vol. 42, No. 6, pp 747–752, IBM.

* cited by examiner

*Primary Examiner*—Jean Bruner Jeanglaude
(74) *Attorney, Agent, or Firm*—Richard A. Henkler; Bracewell & Patterson, L.L.P.

(57) ABSTRACT

A method and system for increasing compression efficiency of a lossless data compression utility. The data compression utility compresses a segmented input data stream into independently decompressible data blocks, and includes a history buffer that maintains a history of matching character sequences. In accordance with the method of the present invention, a data segment is compressed utilizing a history buffer to identify repeated character sequences within the data segment. Upon receipt of a next data segment to be compressed, the history buffer is updated to include a pre-selected data set and reset data from the next data segment. As part of the compression an adaptable cache is searched for non-repeating bytes within a next data segment. Matching bytes are coded as cache references. Further efficiency is obtained by processing the next data segment as two-byte pairs.

33 Claims, 8 Drawing Sheets

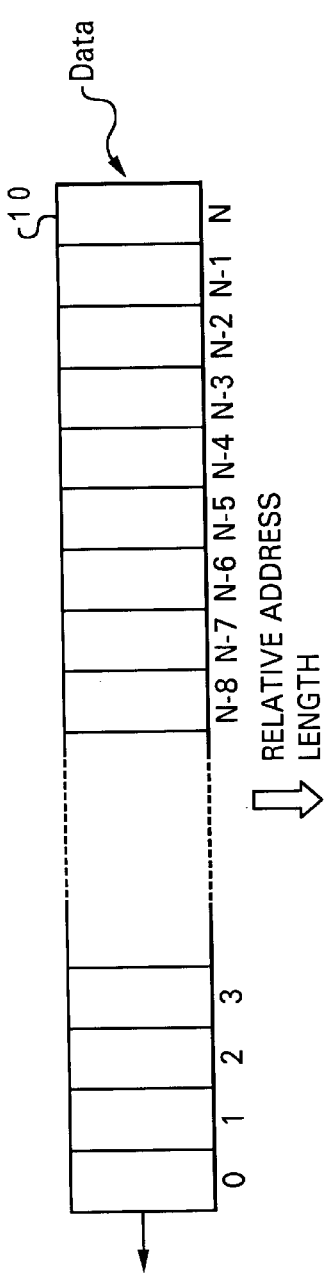
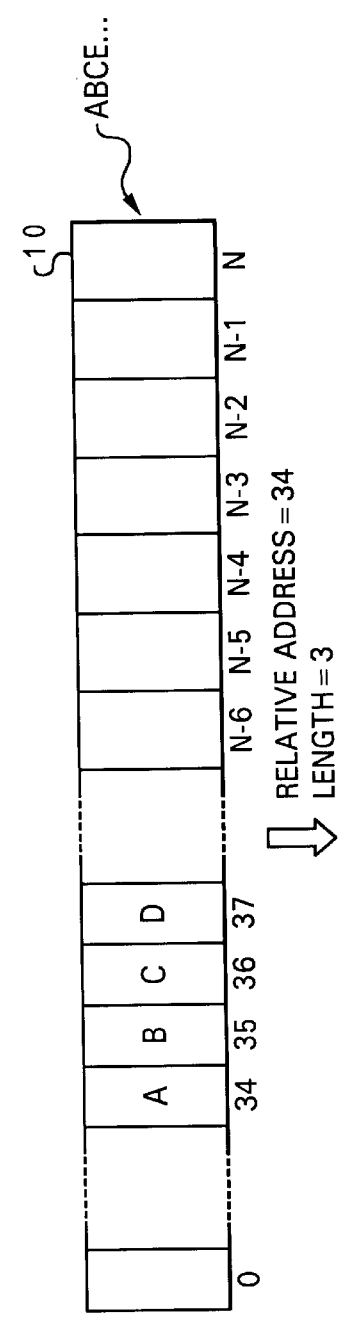
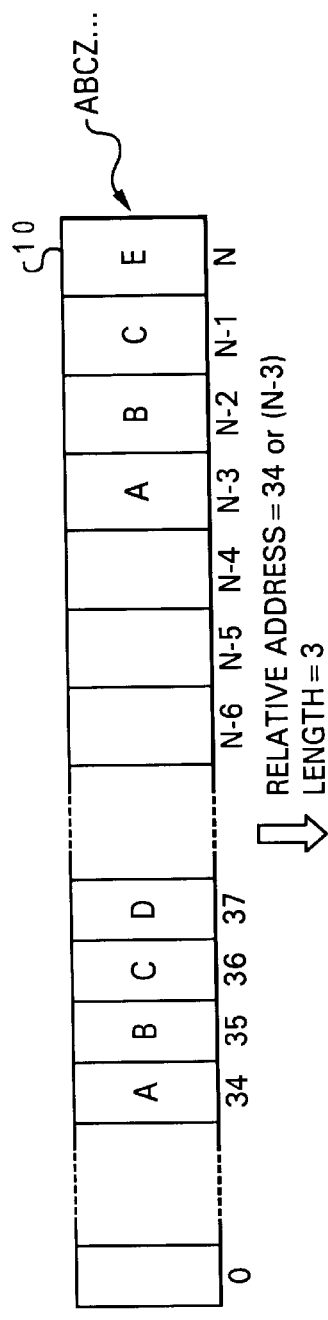
Fig. 1A Prior Art
Fig. 1B Prior Art
Fig. 1C Prior Art

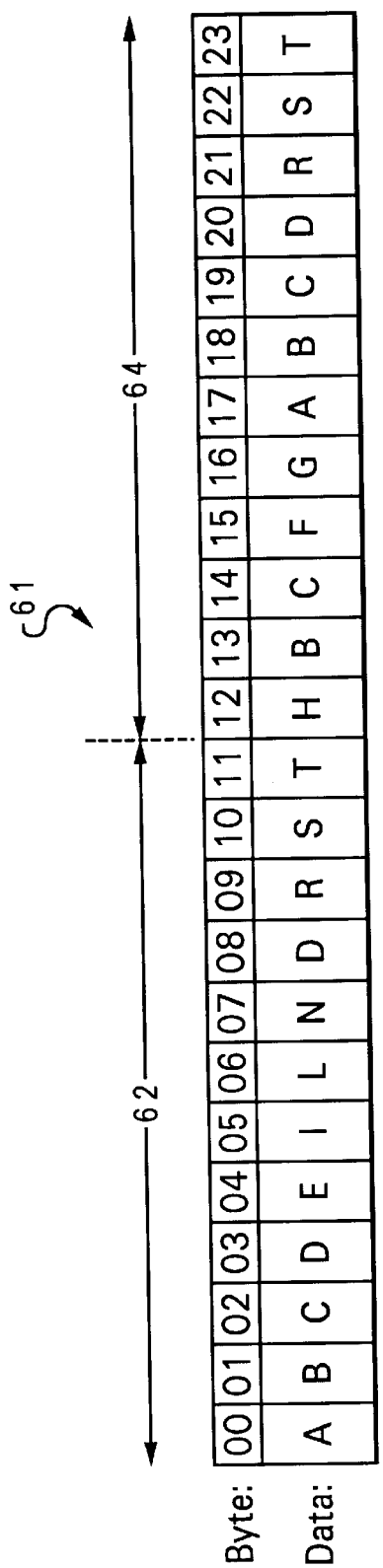

| Encoded Value | Single Byte Length | Double Byte Length |
|---|---|---|
| 2 | 2 bytes | 2 bytes (1 pair) |
| 3 | 3 bytes | 4 bytes (2 pairs) |
| 4 | 4 bytes | 6 bytes (3 pairs) |
| 5 | 5 bytes | 8 bytes (4 pairs) |
| 6 | 6 bytes | 10 bytes (5 pairs) |
| 7 | 7 bytes | 12 bytes (6 pairs) |
| ⋮ | ⋮ | ⋮ |

90

| | 0x0 | 0x1 | 0x2 | 0x3 | 0x4 | 0x5 | 0x6 | 0x7 |
|---|---|---|---|---|---|---|---|---|
| 0x00 | a | b | c | d | e | f | g | h |
| 0x08 | i | j | k | l | m | n | o | p |
| 0x10 | q | r | s | t | u | v | w | x |
| 0x18 |   | : | ; | . | , | ! | ? | " |
| 0x20 | A | B | C | D | E | F | G | H |
| 0x28 | I | J | K | L | M | N | O | P |
| 0x30 | Q | R | S | T | U | V | W | X |
| 0x38 | 0 | 1 | 2 | 3 | 4 | 5 | 6 | 7 |

| 00 | 01 | 02 | 03 | 04 | 05 | 06 | 07 |
|---|---|---|---|---|---|---|---|
| 0x27 | D=01 L=02 | 0x25 | 0x26 | D=00 L=03 | 0x37 | D=12 L=01 | D=10 L=02 |

*Fig. 7B*

METHOD AND SYSTEM FOR IMPROVING LOSSLESS COMPRESSION EFFICIENCY

BACKGROUND OF THE INVENTION

1. Technical Field

The present invention relates in general to computer-aided data compression, and in particular to a high throughput lossless compression technique.

2. Description of the Related Art

The ever increasing processing capacity of modern data processing systems has resulted in a corresponding need for improved data compression techniques. Data compression methods, most of which exploit the redundancy that is characteristic of data streams, have become an essential element of many high speed data communications and storage systems. Data compression is useful in computer-aided communications because it enables devices to transmit the same amount of data in fewer bits.

In communications, a transmitter can compress data before transmitting it, and a receiver can decompress the data after receiving it, thus increasing the effective data rate of the communications channel. In storage applications, data can be compressed before storage and decompressed upon retrieval, thereby increasing the effective capacity of a storage device. Data compression is widely utilized to reduce required storage capacity in backup utilities, spreadsheet applications, and database management systems. Other applications of data compression include magnetic and optical disk interfaces, satellite communications, computer network communications, interconnections between computers and attached devices, tape drive interfaces, and write-once media, where storage capacity is critical.

Compression techniques can be generally categorized as being either lossless or lossy. Lossless data compression transforms a body of data into a smaller body of data from which it is possible to exactly and uniquely recover the original data. Lossy data compression transforms a body of data into a smaller body of data from which an acceptable approximation of the original—as defined by a selected fidelity criterion—can be reconstructed.

Lossless compression is required for applications in which all information in the original stream must be preserved. Such applications include transmission or storage of textual data, such as a printed language, programming language source code or object code, database information, numerical data, and electronic mail. Lossless compression is also utilized for devices such as disk drive controllers that must provide exact preservation and restoration of the object data.

Among the most common approaches to lossless data compression are textual substitution methods, in which frequently-appearing data strings are replaced by shorter indices or pointers that correspond to the data strings in a dictionary or a recent history of the input data stream. For dictionary-based implementations, an encoder module and decoder module are typically utilized to maintain identical copies of a dictionary containing data strings that have appeared in the input stream. The encoder finds matches between portions of the input stream and the previously-encountered strings stored in the dictionary. The encoder then transmits the dictionary index or pointer corresponding to the string in place of the matched string.

The encoder can also update the dictionary with an entry based on the current match and the current contents of the dictionary. If insufficient space is available in the dictionary, space is created by deleting strings from the dictionary. The decoder, operating in a converse manner, receives at its input a set of indices, retrieves each corresponding dictionary entry as a "current match", and updates its dictionary. Because the encoder and decoder operate in a "lock-step" fashion to maintain identical dictionaries, no additional communication is necessary between the encoder and decoder. Thus, the input to the encoder is a stream of bytes or characters, and the output is a sequence of pointers. Conversely, the input to the decoder is a stream of pointers and the output is a stream of bytes or characters.

Implementing conventional dictionary-based compression techniques introduces additional system complexity required for handling the data storage requirements and switching among more than one dictionary. In addition, the efficiency of dictionary-based compression techniques suffers in contexts involving variable data structures and segment sizes.

As an alternative approach to dictionary-based lossless compression techniques, a recent history of the input data stream may be utilized to process and point to matching sequences within the history. The IBM adaptive lossless data compression (ALDC) family of products utilizes a derivative of Lempel-Ziv encoding to compress data. As a general compression technique, the Lempel-Ziv algorithm integrates well into systems required to handle many different data types. This algorithm processes a sequence of bytes by keeping a recent history of the bytes processed and pointing to matching sequences within the history. Compression is achieved by replacing matching byte sequences with a copy pointer and length code that together are smaller in size than the replaced byte sequence.

The performance of any given compression method can be evaluated in terms of compression efficiency, throughput, and latency. Factors affecting the performance of compression techniques such as ALDC in terms of compression efficiency and latency include data stream content and the size of the history buffer with respect to the amount of data to be compressed. As previously explained, ALDC and other LZ1-based compression algorithms rely upon a history buffer to perform compression by finding redundant strings. When the data being compressed is partitioned into small segments, and each compressed segment is required to be independently decompressible, a history buffer reset is required. Resetting the history buffer significantly reduces the compression ratio of a segmented data stream. As the segmentation of a given data stream increases (resulting in smaller segments) the compression ratio correspondingly decreases.

The size of the history buffer relative to the amount of data to be compressed is a limiting factor on the compression ratio of an ALDC compressor. Unmatched symbols are processed in raw form as literals with no compression technique applied thus reducing compression efficiency.

In addition to the above-mentioned performance affecting factors (i.e., data stream content and the size of the history buffer with respect to the amount of data to be compressed), the performance of ALDC in terms of throughput is ultimately limited by the bandwidth of the compression core device. The bandwidth limitation of conventional ALDC cores is one byte per cycle. This one byte per cycle limitation is set in accordance with the compression character increment, which for reasons of compression efficiency, is set to one character (ASCII, for example) per byte. As implemented within current application specific integrated circuit (ASIC) technology, the operational frequency of the core is limited to the system clock. Thus, regardless of data content and history buffer capacity, the maximum output throughput realizable for a conventional ALDC is dependent on the operational frequency of the system in which it is incorporated.

From the foregoing, it can be appreciated that a need exists for an improved adaptive lossless compression technique that reduces the loss of compression incident to resetting the history buffer, enables compression of character sequences not included within the history buffer, and has a compression processing throughput greater than one byte per cycle of the system clock. The present invention addresses such a need by providing a compression system that would improve lossless data compression throughput while minimally impacting compression efficiency.

BRIEF SUMMARY OF THE INVENTION

A method and system for increasing compression efficiency of a lossless data compression utility are disclosed herein. The data compression utility compresses a segmented input data stream into independently decompressible data blocks, and includes a history buffer that maintains a history of the data stream. In accordance with the method of the present invention, a data segment is compressed utilizing a history buffer to identify repeated character sequences within the data segment. The method of processing a data segment entails updating the history buffer to include the data of the data segment while maintaining a preselected data set. The method of the present invention further includes compressing a data segment utilizing a history buffer to identify repeated character sequences within said data segment. As part of the compressing step an adaptable cache is searched for a matching character in response to identifying a next non-repeating character within the data segment. If a matching character is not found within the adaptable cache, a shadow cache is searched for a matching character. Characters found within the adaptable cache are identified in the compressed data stream through a cache reference. A further method to improve compression bandwidth processes data and searches the history buffer with two byte pairs.

All objects, features, and advantages of the present invention will become apparent in the following detailed written description.

BRIEF DESCRIPTION OF THE SEVERAL VIEWS OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 1A–1C are diagrams depicting a conventional Lempel-Ziv technique for compressing data using a relative addressing scheme;

FIG. 4A depicts history buffer contents updated in accordance with a preferred embodiment of the present invention;

FIG. 4B illustrates an output compressed data segment resulting from compression of the updated history buffer contents;

FIG. 4C illustrates an output data segment resulting from double byte compression in accordance with an alternate embodiment of the present invention;

FIG. 7A depicts an adaptive cache that may be utilized to facilitate adaptive lossless data compression in accordance with a preferred embodiment of the present invention;

FIG. 7B illustrates a compressed output block that includes compressed data encoded in accordance with the adaptive cache shown in FIG. 7A.

DETAILED DESCRIPTION OF THE INVENTION

DETAILED DESCRIPTION OF THE PREFERRED EMBODIMENT

Figure 2:
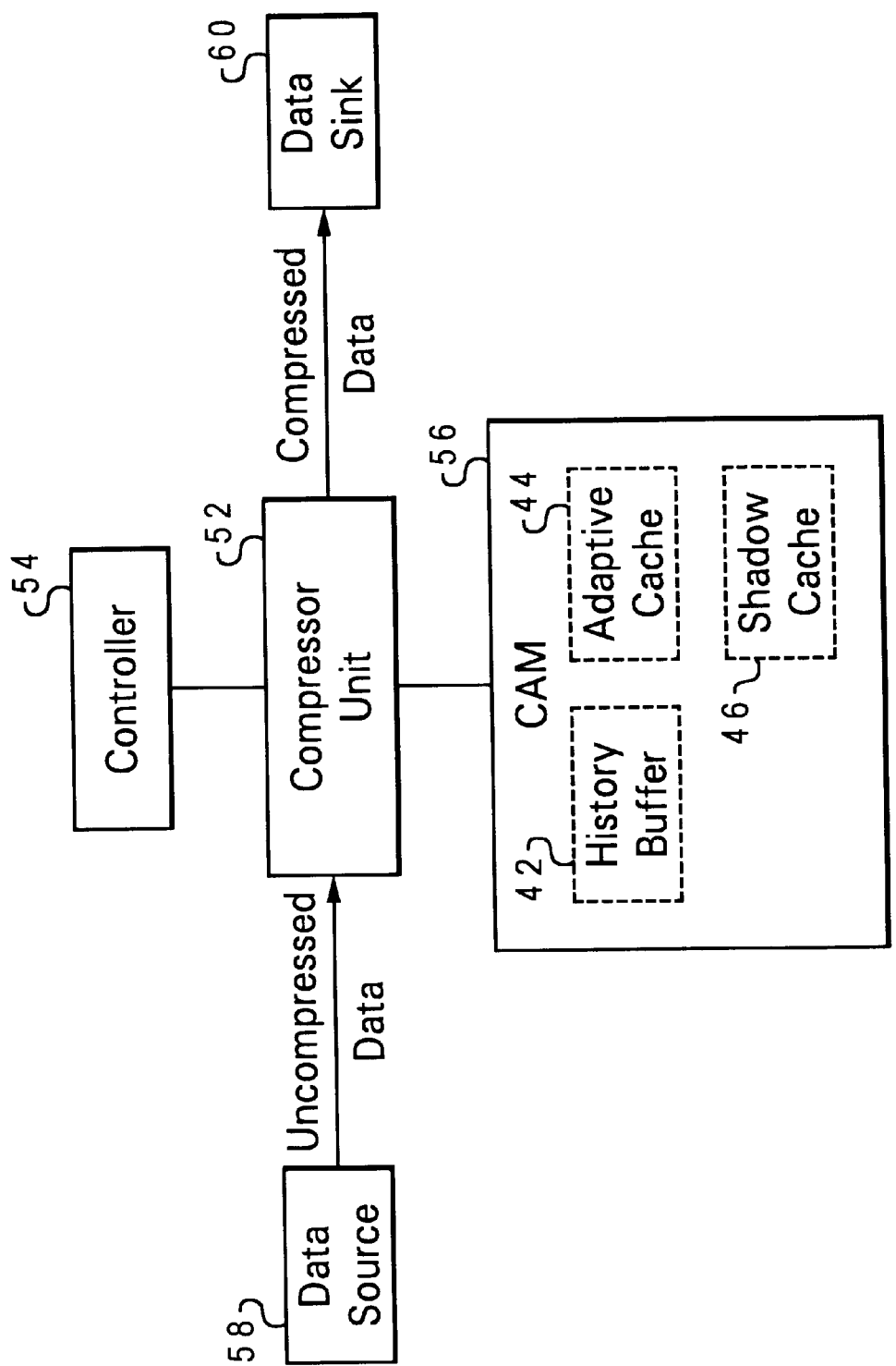
FIG. 2 is a block diagram of a data compressor unit in which a preferred embodiment of the present invention may be incorporated.

This invention is described in a preferred embodiment in the following description with reference to the figures. While this invention is described in terms of the best mode for achieving this invention's objectives, it will be appreciated by those skilled in the art that variations may be accomplished in view of these teachings without deviating from the spirit or scope of the present invention.

The basic Lempel-Ziv algorithm, which is described in "Compression of Individual Sequences via variable Rate Coding" by Lempel and Ziv in IEEE Transactions on Information Theory, September, 1977, pages 530–536, has served as a basis for effective data compression. Adaptive Lossless Data Compression (ALDC) is an IBM Corporation proprietary data compression technique implemented within a family of compression products that employs a derivative of Lempel-Ziv encoding to compress data. The ALDC algorithm processes a sequence of bytes by maintaining a recent history of the bytes processed and pointing to matching sequences within the history. A history buffer is utilized to store the input data stream sequences.

The basic ALDC algorithm is illustrated in FIGS. 1A–1C. As depicted in FIG. 1A, a history buffer 10 that is N+1 bytes long is utilized to temporarily store previously processed data. If new data to be processed includes a string of data bytes that have been processed before, then a copy pointer including the length and relative address of the previously processed data string in the history buffer will be generated. Generally, the new data which includes such a string of previously processed data bytes can be expressed using fewer bits of information than that contained in the data string itself. Consequently, the data string is effectively compressed. If the new data to be processed does not form part of a previous data string existing in the history buffer, there can be no compression and a copy pointer or copy pointers must be generated to specifically specify this condition. In general, such copy pointers have to be expressed using slightly more bits of information that the data itself, so there is an effective expansion. Overall, the gain from the compressed data strings usually exceeds the losses from the non-compressed data strings, so overall data compression results. If there are no repeating strings of data in a data stream, then the data stream cannot be compressed by this technique.

FIG. 1B illustrates the generation of a copy pointer referencing previously processed data. In the example given, the values A, B, C, and D were previously processed and are currently stored in the history buffer at addresses 34, 35, 36, and 37. New values to be processed are A, B, C, and E. The new data includes the string ABC that has a length of 3 and matches previously stored string ABC at relative address 34. The address is relative with respect to the number of data values subsequently processed.

FIG. 1C illustrates the generation of a second copy pointer referencing previously stored data. In the example given, the values A, B, C, and Z are to be processed. The new data includes the string ABC that has a length of 3 and matches the previously stored string ABC at relative address 34 and N−3. The copy pointer generated in this example is usually the lower relative address of N−3. Copy pointers include the count and relative address of the previously processed string and are expressed as (count, relative address). As a result of the compression of values A, B, C, E, A, B, C, and Z as shown in FIGS. 1B and 1C, the generated processed output will include: (3, 34), E, (3, N−3), Z.

Those who are skilled in the art will appreciate that the present invention, as described hereinbelow, could be implemented in hardware or in software. In addition, although the ALDC enhancing techniques described with reference to the following figures are explained in the context of a compression process, those skilled in the art will understand and appreciate the extensions necessary to apply the same inventive principles to a corresponding decompression process.

With reference now to FIG. 2, there is depicted a block diagram of a data compression system in which a preferred embodiment of the present invention may be incorporated. As shown, a compressor unit 52 is coupled to a controller 54 and a content addressable memory (CAM) 56. In the context of an ALDC implementation, compressor unit 52 includes an encoder (not depicted) that accepts data bytes from a data source 58 and provides compressed data bytes to a data sink 60. The CAM 56 includes a history buffer 42 for the encoding logic within compressor unit 52 during compression operations. In one embodiment, the CAM 56 has a selectable history buffer capacity (e.g., 2K, 1K, or 512 byte). The CAM 56 further includes an adaptive cache 44 and a shadow cache 46, which as explained with reference to FIGS. 6, 7, and 8 facilitate the data matching capability for the compression system.

Controller 54 stores all permanent logic for the compressor. During operation, compressor unit 52 receives uncompressed data from data source 58. After data encoding in accordance with the preferred embodiment of the present invention, the compressed data stream is then transmitted to data sink 60. This sink could be a storage device or a communication channel.

When data compression is integrated into a system, that system inevitably imposes its own data structure requirements on the data processed therein. Depending upon the system, the complexity of the structure varies. For example, data stored on hard disks, CD ROMs, and tapes is file oriented, but for hard disks, each file is a collection of discrete clusters. The entire file is accessed on the storage media independent of the underlying structure. In communications systems, data is partitioned into small segments, packets, or frames prior to being transmitted. Along the way, the data segments may be multiplexed with other data segments before reaching their final destination. In each of these systems, the structure is created to help manage the data.

In complex systems requiring higher levels of organization, data is separated into smaller, more manageable segments (e.g., packets, records, etc.). Segmented data can be found everywhere, from communications systems in channel service unit/data service units (CSU/DSUs), to networking protocols (Ethernet, Token Ring, and Asynchronous Transfer Mode (ATM)), and even personal computer file systems (hard disks, CD-ROMs, and tape drives). Partitioning the data permits structure to be preserved during compression and compressed data to be multiplexed after compression. Segmented compression generally requires division of the raw data input into fixed-length or variable length segments prior to compression.

In such systems, most processing operations are performed with respect to the individual segments, and it is thus advantageous to compress each individual segment individually. Invariably, this data partitioning results in a tradeoff between less favorable compression performance for improved individualized data access. In situations in which the data is partitioned into segments, effective compression decreases when the segments are compressed individually. If sequential access to each of the individual data segments can be guaranteed, individualized compression of data segments provides for the retention of the compression context between compression operations, thus enhancing the compression ratio by taking into account the inherent dependency between consecutive segments of data. For example, and with reference to FIGS. 2 and 3, there is illustrated a compression of a series of data segments into dependently and independently decompressible blocks.

A data segment from data source 58 is compressed as explained above, by passing it through compressor unit 52, which, in the context of ALDC, is an ALDC core. In some cases, an entire data structure comprising multiple segments may be available for compression. In these cases, the data structure may be compressed as a single block of data. It is important to note two things about compressing a data structure as a single block. First, any boundary within the original data will be indistinguishable in the compressed data. Second, to retrieve any byte within the original data structure, it is necessary to decompress the entire data structure.

Figure 3:
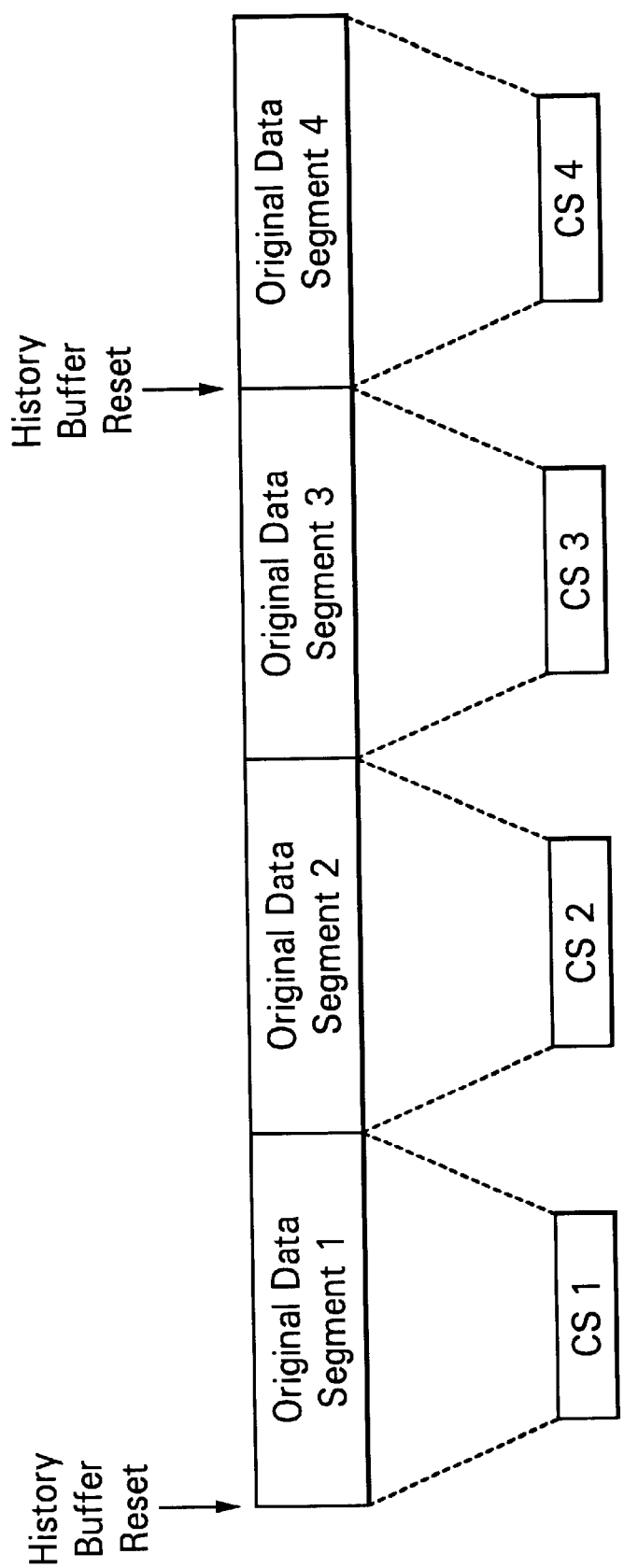
FIG. 3 illustrates compression of a series of data segments into dependently and independently decompressible blocks.

Referring to FIG. 3, when compressing segments 1, 2, 3, and 4, the contents of the history buffer within CAM 56 may either be retained or replaced between segments. If the history buffer contents are retained between segments, the compression efficiency is improved (i.e., compression ratio increases) since data from one segment is utilized as a match against data from a previous segment. During decompression of sequentially compressed data blocks wherein the history buffer data is incrementally maintained and not reset, all previous data blocks must be decompressed prior to decompressing a particular data block. In many systems which employ out of order data transmission, however, such retention of sequential compression data is impracticable. The present invention provides a system for improving the compression efficiency (i.e., increasing the compression ratio) for relatively small data segments within an input data stream such that the resultant compressed data blocks are independently decompressible.

To eliminate inter-block decompression dependency, the contents of the history buffer within CAM 56 is reset between compression of each data segment. Consider the data stream represented in FIG. 3 as original data segments 1, 2, 3, and 4, which are compressed into corresponding compressed blocks 1, 2, 3, and 4. As depicted in FIG. 3, a history buffer reset is performed prior to compressing data segment into compressed block CB1, and also between compression of data segments 3 and 4 into compressed blocks CB3 and CB4. In order to decompress CB2, it will be necessary to decompress both CB1 and CB2, in order. Likewise, it is necessary to decompress CB1, CB2, and CB3, in order to access data in CB3. Since the history buffer within CAM 56 contained no legacy information from data segments 1, 2, or 3 during compression of data segment 4, CB4 is independently decompressible.

The compression ratio achieved by compressor unit 52 is partially a function of history buffer capacity. Thus, each time the history buffer within CAM 56 is reset, the compression of the next segment is degraded from the loss of history from the previous segment(s). Moreover, as the size of input data segments decreases, the effects of resetting the history buffer to permit independent decompression are magnified, and compression of small independently decompressible data blocks becomes very inefficient.

With reference to FIG. 4A, there is depicted a history buffer having contents updated in accordance with a preferred embodiment of the present invention. Specifically, FIG. 4A illustrates a history buffer 6that includes data bytes 00 through 23. Conventional history buffers are utilized to collect bytes from incoming data segments, which are then cross-compared to find matches required for compression. In the embodiment depicted, the data loaded into history buffer 61 includes a first section 62 comprising bytes 00 through 11 and a second section 64 comprising bytes 12 through 23.

In accordance with a preferred embodiment of the present invention, upon receipt of a next data segment to be compressed, history buffer 61 undergoes a bifurcated update aimed at avoiding a total reset of its contents. To this end, the data included within first section 62 is maintained as a pre-selected data set that is loaded into history buffer 61 prior to compression of one or more subsequent data segments. This pre-selected data set may be obtained from one or more previously compressed segments or it may consist of independently selected character sequences. Upon receipt of a next data segment to be compressed, the data within second section 64, which was previously loaded from the previous input data segment, is replaced by data from a next-to-be-compressed data segment in a manner similar to conventional history buffer resetting procedures. It is important to note that first section 62 does not include nor is derived from the data within second section 64. The addition of the pre-selected data into history buffer 61 provides additional compression match bytes while avoiding inter-block decompression dependencies.

The next-to-be compressed data segment contained within bytes 12 through 23 is compressed following the above-described update to history buffer 61. In accordance with known ALDC techniques, the compression algorithm employed by compressor unit 52 compresses data by searching for repeated sequences of characters in byte-wise increments within the contents of history buffer 61. For example, the strings "BC", "ABC", and "DRST", are repeated within history buffer 61 and are thus compressible. It should be noted that the single character string "H" is not compressible since its length is not greater than or equal to two.

The compression process includes the following steps. First, repeated strings (i.e., "BC", "ABC", and "DRST") are identified using known iterative data string comparison algorithmic techniques. Next, the starting address of the first instance of each repeated string is recorded. This address is often referred to as the "displacement." For repeated strings "BC", "ABC", and "DRST", the displacements are recorded as corresponding to byte positions 01, 00, and 08, respectively. The lengths of each repeated character string is also determined and recorded along with the displacement.

FIG. 4B illustrates an output block 65 resulting from compression of the updated history buffer contents in accordance with a preferred embodiment of the invention. As depicted in FIG. 4B, the compressed data is contained in buffer location positions 00 through 05, which do not necessarily represent byte positions since compressed data does not fall on byte boundaries. The non-repeated (i.e., "raw") characters "H", "F", and "G" are recorded in output block 65 as literals. The repeated strings are encoded within output block as copy pointers including the recorded displacement and length values. For example, the repeated string "BC" is recorded in buffer location position 01 as a copy pointer having an encoded displacement 01 and length 2. The pre-selected data maintained within first section 62 is independently stored and thus may be referenced by a decompression utility when output block 65 is decompressed. Thus the content of first section need not be included within output block 65. The bandwidth limitation of conventional ALDC cores is one byte per cycle. This one byte per cycle limitation is set in accordance with the compression character increment, which for reasons of compression efficiency, is set to one byte per symbol (ASCII, for example).

Referring to FIG. 4C, there is illustrated an output data segment resulting from double-byte compression in accordance with an alternate embodiment of the present invention. It should be noted that for double-byte compression, the history buffer contents are not addressed in double-byte units. Instead, as utilized herein, the double-byte compression unit will be referred to as a "symbol" with a symbol comprising two bytes. In this manner, double-byte compression entails addressing half-symbol boundaries.

The compression steps required to compress the contents of history buffer 61 into an output block 63 are as follows. Repeating strings of character pairs (i.e. "HB", "CF", etc.) are identified and the history buffer searched for matching pairs. The starting address and length of the first instance of a repeated pair (i.e. "BC") is then recorded. The length of the string match is recorded as the number of 2-byte pairs contained within the matching string.

Finally, the displacement and length pointers are recorded in output block 63 while the non-repeated double-byte units are recorded in output block 63 as literals. An additional control code must be utilized to support the half-symbol compression of such double-byte compression. Since the raw data may consist of an odd or even number of data bytes, a control code is required to indicate whether the literal ending the compressed data stream contains one or two valid data bytes. Therefore, for double-byte compression there are two defined control codes: END_MARKER_EVEN and END_MARKER_ODD. When a segment ends with the END_MARKER_ODD control code, the proceeding literal contains only one byte of valid data. Segments that end with END_MARKER_EVEN either contain a proceeding literal with two valid data bytes, or a copy pointer. The double-byte compression shown in FIG. 4C results in a higher compression throughput at a potential cost of a lower compression ratio than the single-byte compression shown in FIG. 4B.

Figures 4D, 5:
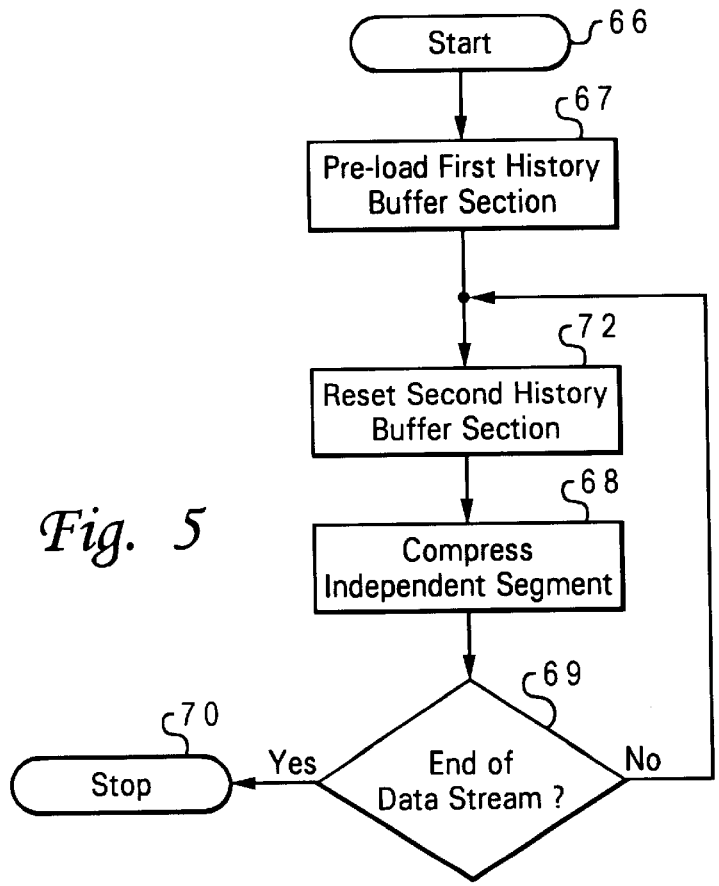
FIG. 4D depicts a comparison of length encoding between single byte encoding and double byte encoding in accordance with a preferred embodiment of the present invention.
FIG. 5 is a flow diagram depicting compression of a series data segments into independently decompressible data blocks in accordance with a preferred embodiment of the present invention.

A comparison of length encoding between single-byte encoding and double-byte encoding in accordance with a preferred embodiment of the present invention is depicted in FIG. 4D. As shown in FIG. 4C, the unmatched pairs of bytes "HB", "CF", and "GA" are recorded as literals with a potential savings of one tag bit per byte pair. Offsetting this savings, is the loss of the string match "BC" encoded under the single-byte compression illustrated in FIG. 4C. The first matched pair in FIG. 4C (i.e. "BC") is encoded with the displacement 01 and a length of 01. The second matched pair (i.e. "DR") begins a string of matched pairs and is encoded with a displacement of 08 and length of 02. The length encoding in double-byte compression uses the same encoding table as single-byte compression as shown in FIG. 4D.

Referring to FIG. 5, there is illustrated a flow diagram depicting compression of a series of data segments into independently decompressible data blocks in accordance with a preferred embodiment of the present invention. The compression process commences as illustrated at step 66 and continues at step 67 with a pre-selected data set being loaded in a first history buffer section. Proceeding to step 72, a second history buffer section is reset as described in further detail with reference to FIG. 6. It should be noted that, depending on the nature of the pre-selected data set described in FIG. 4A, the compression process for the first segment may or may not be identical to the compression of subsequent segments. If, as in one embodiment of the present invention, the pre-selected data set is an independently selected character sequence, compression of the first data segment will proceed identically to compression of subsequent segments with the pre-selected data set maintained in the first history buffer section while the second history buffer section is reset in accordance with the next-to-be-compressed segment. If, however, the pre-selected data set is to be obtained from a previously compressed segment, the pre-selected data set will not be available until one or more segments have been processed and stored within the history buffer.

Following the reset of the second history buffer section at step 72, a next-to-be-compressed data segment is received and sequentially loaded one byte at a time into the designated second section of the history buffer as illustrated at step 68. If the pre-selected data set is obtained from at least one previously compressed data segment, the history buffer preload depicted at step 67 may include retaining a previously loaded segment within the designated first ("preload") section of the history buffer where it will be maintained during subsequent compression iterations. Regardless of the origin of the pre-selected data set, the second, "active" section of the history buffer will be updated with each input data symbol until the independently compressed data segment has been processed at which point the second history buffer section will be reinitialized in preparation for the next input data segment.

As part of step 68, each data symbol is loaded and processed in the history buffer, and the next data segment is compressed in accordance with the content of the history buffer which is incrementally updated with each data symbol within the current data segment. The segment compression depicted at step 68 (described in further detail with reference to FIG. 6) continues until compression of the entire data segment has been completed. The process continues at inquiry step 69 which depicts a determination of whether or not the end of the data stream has been reached. If not, processing of the subsequent data segment commences at step 67. When the end of the data stream has been reached data stream is reached, the process terminates as illustrated at step 70.

Figure 6:
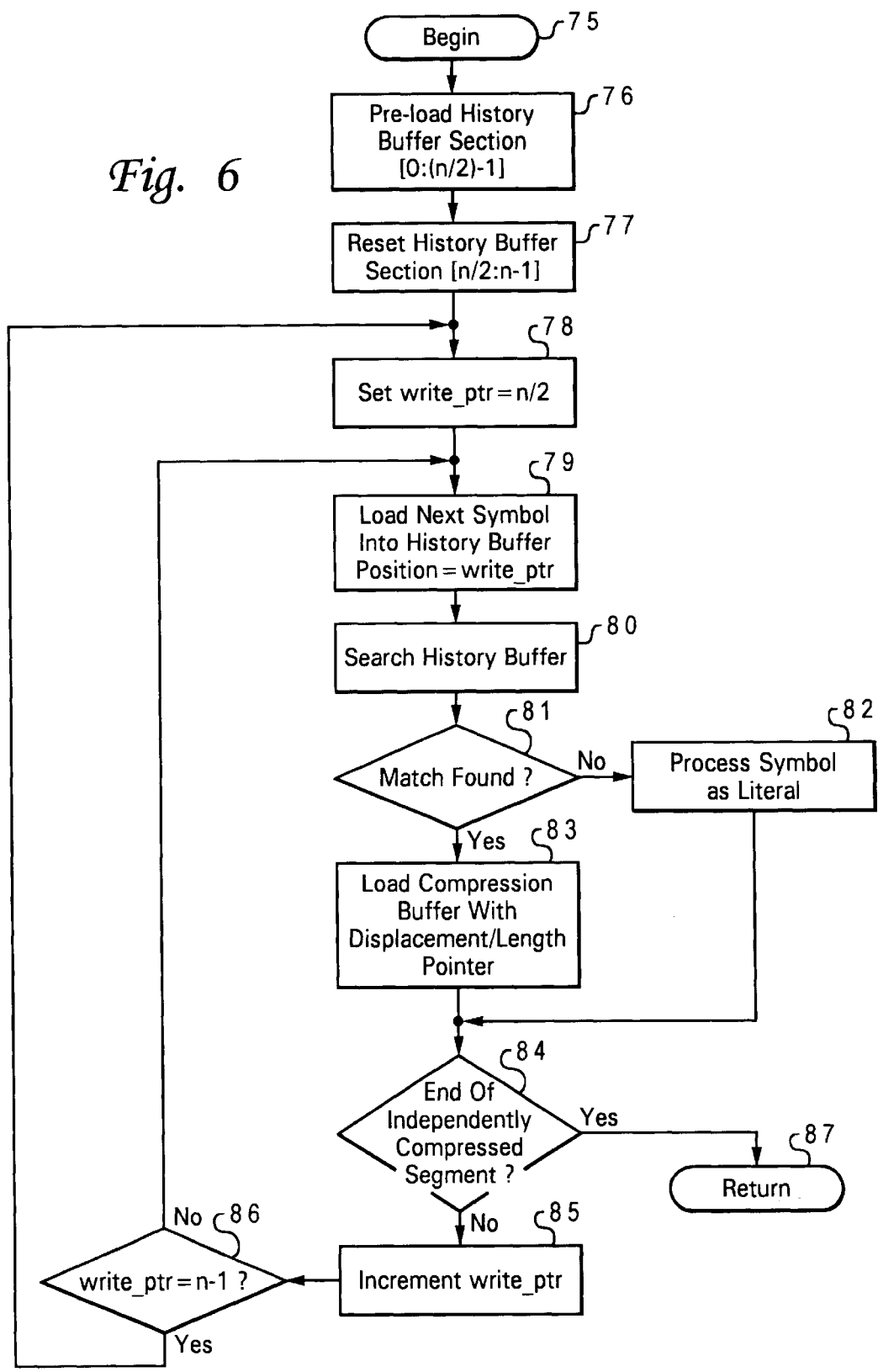
FIG. 6 is a flow diagram illustrating a history buffer update performed in accordance with a preferred embodiment of the present invention.

With reference to FIG. 6, there is depicted a flow diagram illustrating a history buffer update and compression iteration including a more detailed depiction of the process occurring with respect to steps 67 and 68 of FIG. 5 in accordance with a preferred embodiment of the present invention. The process begins as depicted at step 75 and proceeds to step 76, wherein is illustrated the pre-loading of the first section of the history buffer with the pre-selected data set. Assuming that the history buffer has a storage capacity of n bytes, and as shown at step 76, the designated first section of the history buffer occupies approximately half (byte 0 through byte (n/2−1)) of the history buffer.

Next, as illustrated at step 77, a reset is performed with respect to the remaining portion (second section) of the history buffer such that the contents of the second section are incrementally replaced by part or all of the newly arrived next data segment. As utilized herein, a history buffer "reset" refers to the process of invalidating the current data within the designated buffer positions locations in preparation for history buffer updates made during processing of a subsequent independently compressible data segment. In the embodiment depicted, this resetting is performed with respect to bytes n/2 through n−1 for an n-byte history buffer.

Following history buffer reset step 77, the compression process commences at step 78, which depicts setting a write pointer to buffer position n/2 (corresponding to the first position of the second history buffer section). Proceeding to step 79, the next symbol within a given data segment is loaded into the history buffer position corresponding to the current write pointer setting. Next, as depicted at step 80, a search is conducted on the history buffer contents of all valid bytes contained therein. As illustrated at steps 81 and 83, if the search results in a match being found for the currently pointed-to history buffer byte, a copy pointer that includes the displacement/length parameters described with reference to FIG. 4B is written to a corresponding compression buffer position wherein the output compression segment block is stored. If no matching byte is found, the symbol is process and stored within the compression buffer as a literal as shown at step 82. Following either step 82 or 83, the process continues at step 84 wherein a determination is made of whether or not compression of the entire data segment has been completed. If so, the compression process for the segment ends (step 87). If the end of data segment has not been reached, and as illustrated at step 85 the write pointer is incremented to the next byte position within the second section of the history buffer. As illustrated at step 86, the foregoing compression steps are repeated for each byte in the second history buffer section until the end of the second section is reached and the write pointer is reset to the beginning of the second history buffer section (step 78).

FIGS. 2 though 6 describe features of the present invention relating to improving adaptive lossless compression by reducing the loss of compression incident to resetting the history buffer. Another problem associated with conventional ALDC compression techniques relates to the incomprehensive nature of the history data iamb provided by the history buffers. The present invention proposes a cache-assisted ALDC (CAALDC), which as explained in further detail below, provides improved compression efficiency for the search-and-match steps depicted as steps 78 and 79 of FIG. 6.

Referring to FIG. 7A, there is depicted an adaptive cache 90 that may be utilized to facilitate adaptive lossless data compression in accordance with a preferred embodiment of the present invention. As shown in FIG. 7A, adaptive cache 90 is a 64-byte two-dimensional storage space. Each of 64 data symbols are mapped within adaptive cache 90 in accordance with a first location parameter ("0" in for all entries in the depicted embodiment) followed by a second location parameter. For example, the data symbol "J" corresponds to the mapped location at which column $0\overline{A}$-1 intersects row $0\overline{A}$-28. The data symbol "J" is represented within a compressed output block by adding the column and row identifiers to obtain cache reference pointer $0\overline{A}$-29.

With reference to FIG. 7B, there is illustrated a compressed output block 95 that includes compressed data from history buffer 61 (FIG. 4B) encoded in accordance with the adaptive cache shown in FIG. 7A. In accordance with a preferred embodiment of the present invention, the history buffer search previously described for step 90 for a match. The result of this combination history buffer/cache search is, as shown in FIG. 7B, a compressed output block 95 that is a combination of history buffer and adaptive cache references.

In the example provided in FIG. 7B, the overall compression advantage of CAALDC is realized by the considerable number of non-repeated characters matched within adaptive cache 90. Each of the reference pointers to adaptive cache 90 consists of less bits than a literal encoding of the same data byte. A conventional ALDC encoding of a literal may be represented as: <LITERAL>=<0><RAW_BYTE>. This representation consists of the raw byte preceded by a single bit indicator that identifies the byte as not being a coded copy pointer. To accommodate a reference pointer code word in CAALDC, the indicator for literals is expanded to two bits as follows: <LITERAL>=<0 ><0><RAW_BYTE>. The second bit indicator is utilized to indicate the difference between a raw byte literal denoted as <0><0><RAW_BYTE> and a cache reference denoted as <0><1><DICT_REF>. In this manner, when there are a large number of matched non-repeated characters, the overall compression ratio is increased. The cache size need not be limited to 64 bytes. Smaller caches having fewer cache address bits may be utilized to further increase effective compression. However, the benefit derived from fewer address bits must be balanced against a potential cost in compression ratio resulting from fewer matching bytes.

The adaptive cache described with respect to the embodiments depicted in FIGS. 7A and 7B is updated in accordance with a method that alleviates the need for pre-processing the raw data. As explained with reference to FIG. 8, this cache update method can be utilized to maintain the cache with the most frequent non-repeating characters encountered in the raw input data stream.

Figure 8:
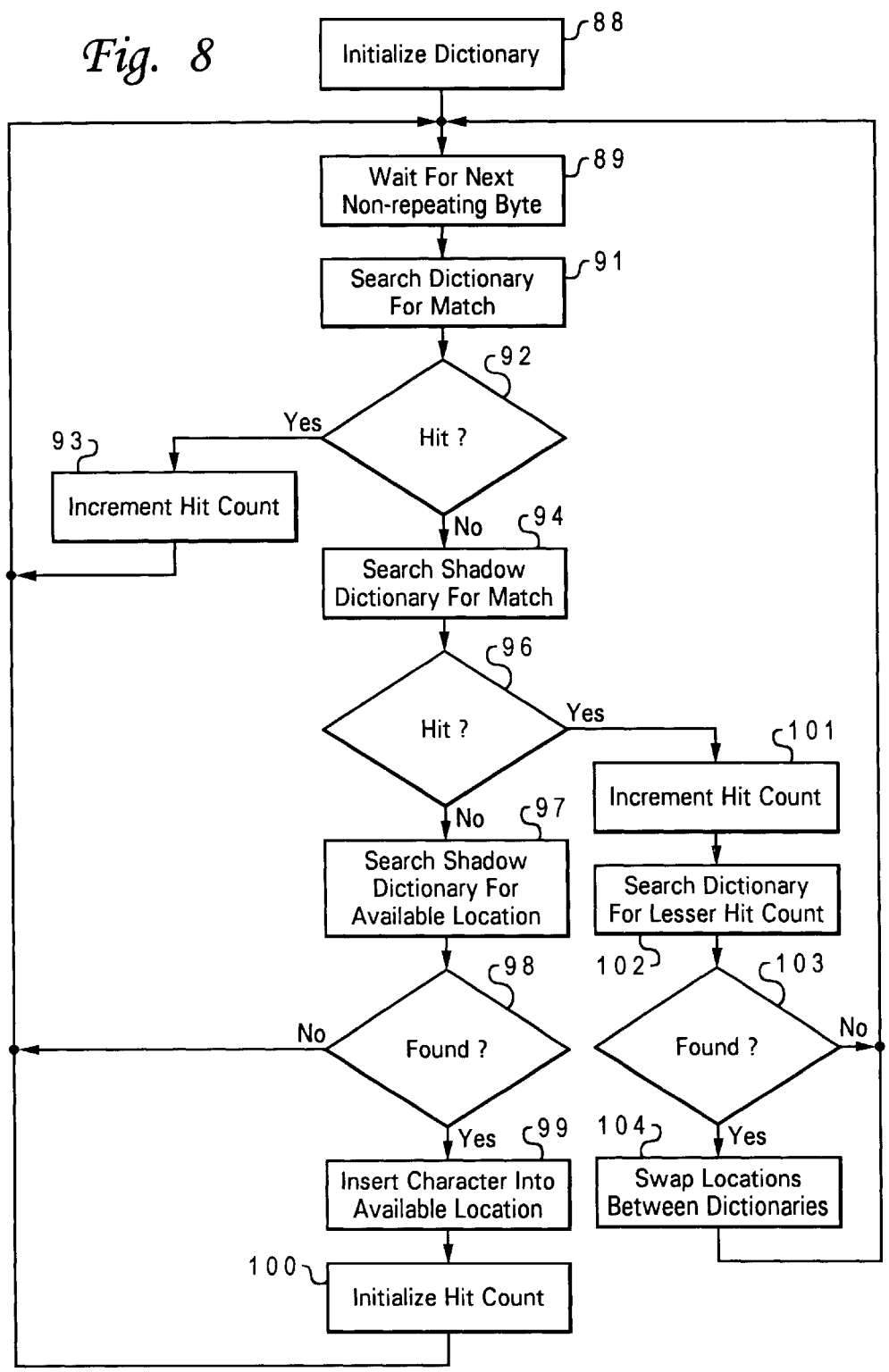
FIG. 8 is a flow diagram depicting an adaptive cache update sequence in accordance with a preferred embodiment of the present invention.

Referring to FIG. 8, there is illustrated a flow diagram depicting an adaptive cache update sequence in accordance with a preferred embodiment of the present invention. The cache update process begins as illustrated at step 88 with initialization of the adaptive cache. The adaptive cache is incorporated into a random access memory such as CAM 56, which is accessed by a compression encoder within a compressor unit such as compressor unit 52. As part of the initialization step, a set of pre-selected characters is mapped into the cache and an indexing system such as the two-dimensional indexing illustrated with reference to FIG. 7A is employed, thus enabling the compression encoder to associate reference pointers to data stream character sequences having matches within the cache.

The update process continues with the compressor unit waiting for a next non-repeating byte within the history buffer as depicted at step 89. When the next non-repeating byte is encountered, as and illustrated at step 91, an adaptive cache, such as that depicted in FIGS. 2 and 4A, is searched for a match. In response to finding a match, a "hit count" maintained within a counter for the matched character(s) is incremented to denote the occurrence of the match as shown at steps 92 and 93. The functionality required to implement such a hit counter must include a normalization function for all counts when one count reaches an implementation-specific maximum count value, and is preferably included within controller 54. After the hit count has been incremented, the process returns to waiting for a next non-repeating byte at step 89.

If, as depicted at steps 92 and 94, no match is found among the currently maintained cache entries, a subsequent search of a shadow cache, such as shadow cache 46 is commenced. In response to finding a match within the shadow directory, the hit count associated with the matched character is incremented as illustrated at step 101. Proceeding to step 102, the accumulated hit count of the matched character within the shadow directory is compared against the accumulated hit counts of each of the characters contained within the adaptive cache. If, as depicted at steps 102, 103, and 104 a lesser hit count is found for a character within the adaptive cache the corresponding characters are swapped (i.e., the character with the lesser hit count within the adaptive cache is swapped with the matched character in the shadow cache) and the process returns to waiting for a next non-repeating byte at step 89.

In response to no match being found within the shadow directory, a search is commenced to find a currently unoccupied shadow directory position (step 97). If, as depicted at step 98, an available shadow cache position is not found, the process returns to waiting for a next non-repeating byte at step 89. If, as depicted at steps 98, 99, and 100, an available unoccupied shadow cache position is found, the unmatched character is inserted into the available location, a hit count for the newly acquired character is initialized and the process returns to waiting for a next non-repeating byte at step 89.

A method and system have been disclosed for increasing compression efficiency of a data compression utility that compresses a segmented input data stream into independently decompressible data blocks. Software written according to the present invention is to be stored in some form of computer readable medium, such as memory, CD-ROM or transmitted over a network, and executed by a processor. Alternatively, some or all of the present invention could be implemented in hardware. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

While the invention has been particularly shown and described with reference to a preferred embodiment, it will be understood by those skilled in the art that various changes in form and detail may be made therein without departing from the spirit and scope of the invention.

What is claimed is:

1. A method for increasing compression efficiency of a data compression utility that utilizes a history buffer to maintain a history of matching character sequences, said method comprising:

compressing a data segment utilizing a history buffer to identify repeated character sequences within said data segment;

upon receipt of a next data segment to be compressed, updating said history buffer to include pre-selected data and newly buffered data from said next data segment;

in response to identifying a non-repeating character within said updated history buffer, searching a cache for a matching character; and in response to not finding a matching character within said cache, searching a shadow cache for a matching character.

2. The method of claim 1, wherein said pre-selected data is obtained from at least one previous data segment.

3. The method of claim 1, wherein said pre-selected data includes independently selected character sequences.

4. The method of claim 1, wherein said updating said history buffer further comprises:

pre-loading a first section of said history buffer with said pre-selected data set;

resetting a second section of said history buffer to invalidate data currently stored therein; and loading into said second section a next data segment from said input data stream.

5. The method of claim 4, wherein said pre-loading further comprises:

loading said pre-selected data into said first section of said history buffer; and utilizing said pre-selected data within said first section of said history buffer during compression of said next data segment.

6. The method of claim 4, wherein said resetting a second section of said history buffer further comprises invalidating data within said second section of said history buffer.

7. The method of claim 6, further comprising:

for each character sequence within said next data segment:

searching all valid data within said history buffer for a matching character sequence;

in response to finding no match for a given character sequence of said next data segment, processing said unmatched character sequence as one or more literals;

writing said unmatched character sequence into a location indicated by a history buffer write pointer; and incrementing a history buffer write pointer to point to a next history buffer location and repeating said searching and processing steps.

8. The method of claim 7, further comprising in response to said history buffer write pointer being set to a boundary between said first and second history buffer sections, resetting said history buffer pointer to the beginning of said second history buffer section.

9. The method of claim 1, wherein a hit count is associated with each character included within said cache and said shadow cache, said method further comprising:

in response to finding a matching character within said shadow cache, incrementing a hit count associated with said matching character;

searching said cache for a character having a lesser hit count than said matching character; and in response to finding a character having a lesser hit count than said matching character, swapping said matching character and said character having a lesser hit count within said cache and said shadow cache.

10. The method of claim 9, further comprising:

in response to not finding a matching character within said shadow cache, searching for an unoccupied position within said shadow cache;

in response to finding an unoccupied position within said shadow cache, inserting said non-repeating character into said unoccupied position; and initializing a hit count for said inserted non-repeating character.

11. The method of claim 9, further comprising:

in response to a hit count associated with said cache and said shadow cache equaling an implementation maximum, renormalizing all hit counts associated with said cache and said shadow cache.

12. The method of claim 1, wherein said compressing a data segment further comprises:

identifying repeated strings of character pairs within said history buffer; and recording within a compressed output block:

a starting address of the first instance of each of said repeated strings of character pairs; and a number of matching character pairs within each of said repeated strings.

13. The method of claim 12, wherein said number of matching character pairs within each of said repeated strings is recorded as a length pointer for each of said repeated strings.

14. The method of claim 12, wherein said starting address of the first instance of each of said repeated strings is recorded within said compressed output block as a displacement pointer for each of said repeated strings.

15. A system for increasing compression efficiency of a data compression utility that utilizes a history buffer to maintain a history of matching character sequences, said system comprising:

processing means for compressing a data segment utilizing a history buffer to identify repeated character sequences within said data segment; and processing means responsive to receiving a next data segment to be compressed, for updating said history buffer to include pre-selected data and newly buffered data from said next data segment;

processing means responsive to identifying a non-repeating character within said updated history buffer, for searching a cache for a matching character;

processing means responsive to not finding a matching character within said cache, for searching a shadow cache for a matching character;

processing means responsive to finding a matching character within said shadow cache, for incrementing a hit count associated with said matching character;

processing means for searching said cache for a character having a lesser hit count than said matching character; and processing means responsive to finding a character having a lesser hit count than said matching character, for swapping said matching character and said character having a lesser hit count within said cache and said shadow cache.

16. The system of claim 15, wherein said pre-selected data is obtained from at least one previous data segment.

17. The system of claim 15, wherein said pre-selected data consists of independently selected character sequences.

18. The system of claim 15, wherein said processing means for updating said history buffer comprises:

processing means for pre-loading a first section of said history buffer with said pre-selected data set;

processing means for resetting a second section of said history buffer to invalidate data currently stored therein; and processing means for loading into said second section a next data segment from said input data stream.

19. The system of claim 18, wherein said processing means for pre-loading comprises:

processing means for loading said pre-selected data into said first section of said history buffer; and processing means for utilizing said pre-selected data within said first section of said history buffer during compression of said next data segment.

20. The system of claim 18, wherein said processing means for resetting a second section of said history buffer comprises processing means for invalidating data within said second section of said history buffer.

21. The system of claim 20, further comprising:

processing means for compressing said next data segment by, for each character sequence within said next data segment:

searching all valid data within said history buffer for a matching character sequence;

in response to finding no match for a given character sequence of said next data segment, processing said unmatched character sequence as one or more literals;

writing said unmatched character sequence into a location indicated by a history buffer write pointer; and incrementing a history buffer write pointer to point to a next history buffer location and repeating said searching and processing steps.

22. The system of claim 21, further comprising processing means responsive to said history buffer write pointer being set to a boundary between said first and second history buffer sections, for resetting said history buffer pointer to the beginning of said second history buffer section.

23. The system of claim 15, wherein said processing means for compressing a data segment comprises:

processing means for identifying repeated strings of character pairs within said history buffer; and processing means for recording within a compressed output block:

the starting address of the first instance of each of said repeated strings of character pairs; and the number of matching character pairs within each of said repeated strings.

24. The system of claim 23, wherein the starting address of the first instance of each of said repeated strings is recorded within said compressed output block as a displacement pointer for each of said repeated strings.

25. The system of claim 23, wherein the number of matching character pairs within each of said repeated strings is recorded as a length pointer for each of said repeated strings.

26. The system of claim 15, further comprising:

processing means responsive to not finding a matching character within said shadow cache, for searching for an unoccupied position within said shadow cache;

processing means responsive to finding an unoccupied position within said shadow cache, for inserting said non-repeating character into said unoccupied position; and processing means for initializing a hit count for said inserted non-repeating character.

27. The system of claim 15, further comprising:

processing means responsive to a hit count associated with said cache and said shadow cache equaling an implementation maximum, for renormalizing all hit counts associated with said cache and said shadow cache.

28. A method for increasing compression efficiency of a data compression utility that utilizes a history buffer to maintain a history of matching character sequences, wherein said data compression utility includes a cache and a shadow cache for matching characters within said input data stream, said method comprising:

in response to identifying a next non-repeating character within said history buffer, searching said cache for a matching character;

in response to finding a matching character within said cache, incrementing a hit count for said matching character, wherein said hit count is associated with each character included within said cache; and in response to not finding a matching character within said cache, searching said shadow cache for a matching character.

29. The method of claim 28, further comprising:

in response to finding a matching character within said shadow cache, incrementing a hit count for said matching character, wherein said hit count is associated with each character included within said shadow cache;

searching said cache for a character having a lesser hit count than said matching character; and in response to finding a character having a lesser hit count than said matching character, swapping said matching character and said character having a lesser hit count within said cache and said shadow cache.

30. The method of claim 29, further comprising:

in response to not finding a matching character within said shadow cache, searching for an unoccupied position within said shadow cache;

in response to finding an unoccupied position within said shadow cache, inserting said next non-repeating character into said unoccupied position; and initializing a hit count for said inserted next non-repeated character.

31. A system for increasing compression efficiency of a data compression utility that utilizes a history buffer to maintain a history of matching character sequences, wherein said data compression utility includes a cache and a shadow cache for matching characters within said input data stream, said system comprising:

processing means responsive to identifying a next non-repeating character within said history buffer for searching said cache for a matching character;

processing means responsive to finding a matching character within said cache for incrementing a hit count for said matching character, wherein said hit count is associated with each character included within said cache; and processing means responsive to not finding a matching character within said cache for searching said shadow cache for a matching character.

32. The system of claim 31, further comprising:

processing means responsive to finding a matching character within said shadow cache for incrementing a hit count for said matching character, wherein said hit count is associated with each character included within said shadow cache;

processing means for searching said cache for a character having a lesser hit count than said matching character; and processing means responsive to finding a character having a lesser hit count than said matching character for swapping said matching character and said character having a lesser hit count within said cache and said shadow cache.

33. The system of claim 32, further comprising:

processing means responsive to not finding a matching character within said shadow cache for searching for an unoccupied position within said shadow cache;

processing means responsive to finding an unoccupied position within said shadow cache for inserting said next non-repeating character into said unoccupied position; and processing means for initializing a hit count for said inserted next non-repeated character.

\* \* \* \* \*